(12) United States Patent
Dieckhoff et al.

(10) Patent No.: US 7,410,669 B2
(45) Date of Patent: Aug. 12, 2008

(54) PROCESS AND APPARATUS FOR THE COATING OR MODIFICATION OF SURFACES

(75) Inventors: Stefan Dieckhoff, Lilienthal (DE); Ralph Wilken, Bremen (DE)

(73) Assignee: Fraunhofer Gesellschaft Zur Forderung Der Angewandten Forschung E.V., Munich (DE)

( * ) Notice: Subject to any disclaimer, the term of this patent is extended or adjusted under 35 U.S.C. 154(b) by 32 days.

(21) Appl. No.: 11/344,609

(22) Filed: Feb. 1, 2006

(65) Prior Publication Data

US 2006/0127574 A1    Jun. 15, 2006

Related U.S. Application Data

(63) Continuation of application No. PCT/EP2004/051659, filed on Jul. 29, 2004.

(30) Foreign Application Priority Data

Aug. 2, 2003    (DE) ................. 103 35 470

(51) Int. Cl.
*C23C 16/00* (2006.01)
(52) U.S. Cl. ................. 427/248.1; 427/249.11
(58) Field of Classification Search ............. 427/248.1, 427/249.11; 118/715
See application file for complete search history.

(56) References Cited

U.S. PATENT DOCUMENTS

| | | | |
|---|---|---|---|
| 5,079,038 A | 1/1992 | Rye | |
| 5,256,206 A | 10/1993 | Anthony et al. | |
| 5,516,554 A | 5/1996 | Gasworth | |
| 6,194,036 B1 * | 2/2001 | Babayan et al. | 427/563 |
| 6,558,742 B1 * | 5/2003 | Tzeng | 427/249.8 |
| 2003/0032265 A1 * | 2/2003 | Deng et al. | 438/482 |

FOREIGN PATENT DOCUMENTS

| | | |
|---|---|---|
| EP | 0 324 538 A | 7/1989 |
| EP | 0 561 511 | 9/1993 |
| EP | 0 637 639 | 2/1995 |
| JP | 02 092 895 | 4/1990 |
| WO | WO 00/47795 | 8/2000 |

OTHER PUBLICATIONS

Japanese Journal of Applied Physics, vol. 21, No. 4, Apr. 1982, pp. L183 to L185. (Matsumoto, S., et al.: "Vapor Deposition of Diamond Particles from Methane.").
Haubner, R. et al: "Diamond growth by hot-filament chemical vapor deposition: state art," Diamond and Related Materials, Elsevier Science Publishers, Amsterdam, NL, vol. 2, 1993, pp. 1277-1294.

(Continued)

*Primary Examiner*—Timothy Meeks
*Assistant Examiner*—Elizabeth A Burkhart
(74) *Attorney, Agent, or Firm*—Weingarten, Schurgin, Gagnebin & Lebovici LLP

(57) ABSTRACT

In a process according to the invention and an apparatus according to the invention for the coating or modification of a surface a flow of a first gaseous phase or of a first aerosol comprising one or more precursor compounds is guided along a heated filament so that the precursor compounds are converted into reactive compounds. Alternatively, non-activated particles are guided along a heated filament so that these are activated and are then combined with a gaseous phase or an aerosol comprising a plurality of precursor compounds, so that the precursor compounds are thereby converted into reactive compounds. The reactive compounds formed according to at least one of the two aforementioned steps are guided onto a substrate that is exposed to atmospheric pressure, so that a layer is deposited on the substrate or its surface is modified.

9 Claims, 1 Drawing Sheet

OTHER PUBLICATIONS

Figure 1:
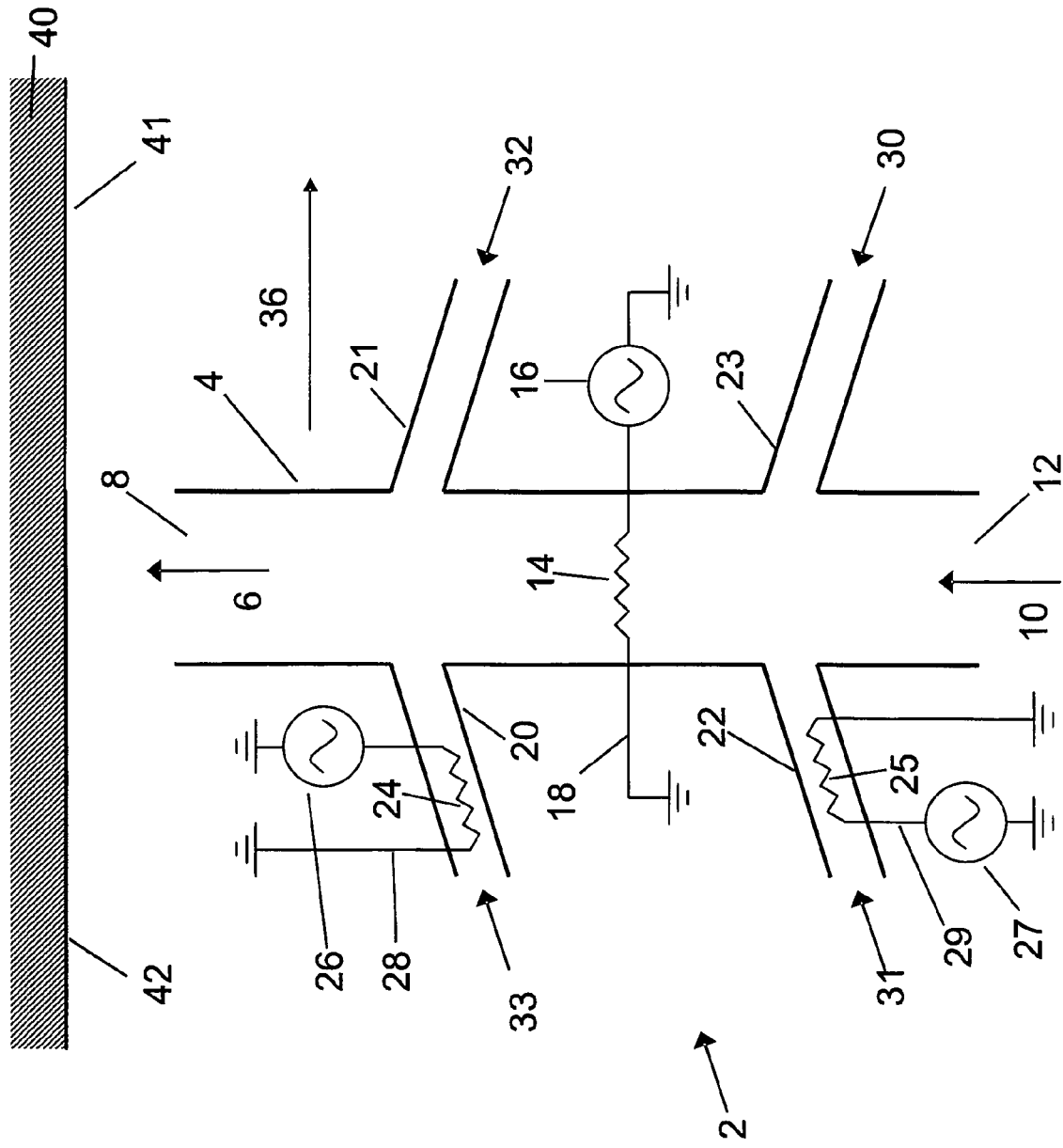

Morrish, A.A. et al: "Effects of surface pretreatments on nucleation and growth of diamond films on a variety of substrates," Applied Physics Letters, American Institute of Physics, New York, NY, US, vol. 59, No. 4, Jul. 22, 1991.

* cited by examiner

PROCESS AND APPARATUS FOR THE COATING OR MODIFICATION OF SURFACES

This application is a continuation of International Application No. PCT/EP2004/051659 with an international filing date of Jul. 29, 2004, and claims priority from German patent application No. 103 35 470.0 filed Aug. 2, 2003.

BACKGROUND OF THE INVENTION

The present invention relates to a process and an apparatus for the coating or modification of surfaces.

Gaseous phase layer depositions or also CVD (Chemical Vapour Deposition) processes are known for the coating of surfaces with layers as thin as possible in the range from 0.5 nm to 50 μm, in order to alter for example the corrosion resistance of the material to be coated or the adhesive properties of the surface. In gaseous phase layer deposition a gaseous phase is excited in a regulated manner, physico-chemical processes occur within the gaseous phase, and as a result thin layers are formed on substrates. The temperatures in these processes are as a rule between 200 and 2000° C. Depending on the nature of the energy source one speaks of thermal, plasma-activated, photon-activated or laser-activated gaseous phase layer depositions. The gaseous components are normally led together with a carrier gas at pressures between 10 mbar and 1 bar through a reaction chamber, in which the physico-chemical processes take place and in which the solid-state components that are thereby formed are deposited as a thin layer on substrates. The volatile byproducts are removed together with the carrier gas.

In gaseous phase layer depositions, in which so-called cold plasmas are used as the energy source, the process is carried out at low pressures that lie significantly below the atmospheric pressure of about 1 bar.

From DE 102 36 430 a thermal process for low-temperature gaseous phase deposition is known, in which the coating process takes place within a reaction chamber. The reaction chamber is connected to a pump that serves to regulate the pressure and to remove byproducts and excess gases from the reaction chamber.

In addition processes are also known in which a so-called thermal plasma is used for the coating. In these processes, which are also termed plasma spraying processes, the operation may be carried out under atmospheric pressure, which means that a special pressure chamber is therefore not necessary. In the plasma spraying process a gas is heated in an arc discharge of high output, namely 5 to 100 kW, to a high temperature of 400 to 10,000 K in order to accelerate metal or ceramics particles to velocities of above 100 m/sec, which are introduced into the discharge and form molten droplets in the hot gaseous stream. The hot molten droplets solidify when they strike the surface to be coated and form there the desired layer. The layer thickness in plasma spraying processes is between 100 μm and a few mm.

From DE 199 55 880 a process is known for the plasma-activated deposition of layers in so-called barrier or corona discharges at atmospheric pressure. In this case a corona discharge is ignited between one or more electrodes and the substrate, which must be metallically conductive. The coating is thereby deposited on the surface of the substrate. Reference should also be made to DE 195 15 069 and DE 195 05 449.

From Japanese Journal of Applied Physics, Vol. 21, No. 4, 1982, L183 to L185 a gaseous phase deposition of diamond particles is known, in which the activation of a methane-hydrogen mixture necessary for the deposition is produced by means of a hot filament. The deposition for the coating takes place in a reduced pressure chamber, in which the pressure during the coating is between about $1/100$ and $1/10$ bar and the flow rate is ca. 10 ml/min. The reduced pressure chamber is also heated by a furnace situated outside the chamber. In WO 00/47795 a gaseous phase deposition with the aid of a hot filament in a reaction chamber is likewise described; the substrate is in this case subjected to a pressure of about 40 Torr. Reference should also be made to EP 0637639, U.S. Pat. No. 5,256,206, EP 0561511, U.S. Pat. No. 5,079,038 and JP 2092895.

From DE 198 07 086 a process is known for coating surfaces of a substrate, in which a first gaseous phase is brought into the plasma state by means of an electrical field and forms a plasma jet. A second gaseous phase that contains one or more precursors, an aerosol and/or a pulverulent solid is then introduced into this plasma jet, and particle species suitable for the layer deposition are formed by physico-chemical reactions between the plasma-activated gaseous phase and the admixed gaseous phase. These particle species are transported for the layer deposition by the plasma jet to the substrate to be coated and form a layer on the latter. The process can be carried out under atmospheric pressure. High voltage electrodes are necessary in order to generate the electrical field that is required to convert the gaseous phase into the plasma state. The voltage for generating the electrical field is for example 12 kV and has a sinusoidal frequency of 20 kHz.

The coating processes known from the prior art—insofar as they are at all suitable for forming thin layers—are disadvantageous insofar as a high investment in apparatus is necessary to carry out the processes. The majority of the aforementioned processes, and more especially the hot-filament processes, require a pressure-tight reaction chamber. This means that a corresponding pumping technique is required in order to be able to adjust the necessary pressure conditions in the reaction chamber. In addition investment costs are involved in receivers and containers. A further disadvantage arising from the need for a reaction chamber is that the substrate whose surface is to be coated has to be arranged in the reaction chamber. This in turn means that such a process must in principle be carried out discontinuously if substrate batches are to be coated one after the other. There is also the fact that the size of the reaction chamber must match the size of the substrate. The high expenditure on apparatus also means that the execution of the process is very labour-intensive unless a cost-intensive automation is carried out in a complex coating plant.

Although the process that is described in DE 198 07 086 does not require a closed reaction chamber, nevertheless here too the expenditure on apparatus is still high. In particular, the generation of an electrical field requires the provision of a high voltage source. Apart from the high voltage source that according to the aforementioned printed specification has to be provided as generator, suitable high voltage electrodes also have to be provided. In order to achieve a strong electrical field a high voltage must exist between the electrodes, which should be as close together as possible. The formation of an undesirably hot discharge or arc discharge between the electrodes, which can lead to the destruction of the electrodes and substrate, can be avoided if the flow of the gaseous phase that is to be converted into the plasma state is matched to the time-variable voltage at the electrodes. In this connection a dielectric or a plurality of dielectrics may in addition also be provided between the electrodes and the plasma.

The provision of the electrical field is thus complicated and difficult. The production of the apparatus, especially in the region of the electrodes, requires a high degree of accuracy. In addition there is the fact that in the implementation of the process the electrical voltage for generating the electrical field must be accurately matched to the gaseous stream guided between them. It must also be borne in mind that the use of high voltage is likewise governed by special safety requirements, which necessitate appropriate safety measures.

OBJECTS OF THE INVENTION

The object of the invention is accordingly to provide a process for the coating or modification of surfaces that requires less effort and expenditure compared to known processes and permits a higher flexibility in use. A further object of the present invention is to provide an apparatus that can be used for the implementation of the process.

SUMMARY OF THE INVENTION

According to the invention a process is provided for the coating or modification of a surface, involving the following steps:
  a) provision of a first gaseous phase or a first aerosol, comprising one or more precursor compounds that can be converted by heating on a filament and/or by reaction with activated particles into one or more reactive compounds that (i) can be deposited on a substrate with the formation of a layer or (ii) can modify a substrate surface,
  b) guiding a flow of the first gaseous phase or of the first aerosol along a first heated filament
     and/or
     guiding non-activated particles along a heated filament or along a first and/or second heated filament so that they are activated, and combining a flow or the flow of the first gaseous phase or of the first aerosol with the activated particles so that the activated particles react with the precursor compounds,
     so that the precursor compound(s) is/are converted into the reactive compound(s),
     the overall particle stream density in the flow after formation of the reactive compound(s) being >10 mole/(m$^2$s),
  c) leading the one or more reactive compound(s) formed according to step b) onto a substrate so that (i) a layer is deposited on the substrate or (ii) the surface of the substrate is modified.

Preferred gaseous phases include for example air, nitrogen, argon, sulfur hexafluoride.

An aerosol is understood in this connection to be any gas or gaseous mixture that contains solid and/or liquid particles dispersed therein as so-called suspended matter.

According to the aforementioned step b), in the first alternative the first gaseous phase or the aerosol, which comprises one or more precursor compounds, is guided along a first heated filament so that the at least precursor compound is converted into the at least one reactive compound.

According to the second alternative, non-activated particles are first of all guided along a first and/or second (and/or one or more further) filaments and thereby activated. The activated particles are then combined with the first gaseous phase or the first aerosol, so that they react with the precursor compounds to form reactive compounds.

The two alternatives may also be combined, so that a proportion of the reactive compounds are formed according to the first-described alternative and a further proportion of the reactive compounds are formed according to the second-described alternative.

In step c) the reactive compounds formed according to step b) or at least a proportion thereof are guided onto a substrate so that a layer is deposited on this substrate or its surface is modified. At the same time the substrate is preferably exposed to atmospheric pressure, which means that no pressure-tight screening of the substrate against the surroundings is carried out. In this connection the surroundings are understood to denote the space in which the process is employed, such as for example a production premises, a laboratory or also a workplace exposed to the atmosphere. The exact value of the atmospheric pressure is not especially important; however, the process is preferably not specifically carried out in a special pressure chamber or reduced pressure chamber, although this is of course also possible.

The process can be carried out in a normal air atmosphere. It should be noted that although the pressure on the substrate then corresponds roughly to atmospheric pressure, nevertheless the pressure at the filament may be significantly higher.

In a preferred embodiment the process according to the invention is characterised in that the first gaseous phase or the first aerosol contains at least an inert gas and/or air.

By using air and/or at least an inert gas, such as for example Ar, $N_2$ or $SF_6$, the conversion of reactive compounds into non-reactive compounds can in particular be delayed.

Just as with the choice of the flow velocity of the flow containing the reactive compounds, the choice of the composition of gaseous phase(s) and/or aerosol(s) influences the mean path length of the reactive compounds until they are converted into non-reactive compounds.

In the process according to the invention step b) is preferably carried out in a flow hollow body that guides the flow of the first gaseous phase or aerosol and/or non-activated particles. In this way the width, size and/or the direction of the flow can be specified beforehand in a simple way. Preferably the filament or filaments is/are fixed in the flow hollow body so that the first gaseous phase or the first aerosol and/or the non-activated particles are guided along the corresponding filament or filaments.

In many cases it is advantageous to arrange the substrate to be coated or to be modified outside the flow hollow body.

In this case the flow that carries the reactive compounds is advantageously directed onto the substrate by means of the flow hollow body. The substrate may in this connection be arbitrarily large, irrespective of the dimensions of the flow hollow body. To coat a substrate of large surface area the outlet of the flow hollow body can be guided along the surface to be coated and/or the substrate can be guided along the outlet of the flow hollow body, so that the flow that carries the reactive compounds and thus the reactive compounds themselves reach every region of the surface to be coated. Preferably the stream density in the flow that carries the reactive compounds is at the outlet of the flow hollow body >10 mole/(m$^2$s), preferably >100 mole/(m$^2$s).

Particularly relevant for the thickness of the layer to be formed is the relative movement of the substrate with respect to the flow hollow body and also their spacing from one another (variable or constant in the process). In many cases the relative movement is advantageously maintained constant.

It is furthermore advantageous if the reactive compounds exit from the flow hollow body in a gaseous phase flow or aerosol flow directed onto the substrate. In this connection the exit preferably takes place roughly perpendicular to the substrate surface to be coated.

Alternatively, the substrate to be coated or modified may be arranged within the flow hollow body, downstream of one or more filaments; with such an arrangement powder particles for example can be coated, which for example trickle through the flow hollow body.

According to a further preferred modification of the process of the invention at least a second gaseous phase or a second aerosol is combined in the flow direction with the first gaseous phase or with the first aerosol in front of the first filament and/or behind the first filament. In this connection, according to a further modification the second gaseous phase or the second aerosol is guided, in front of the combination with the first gaseous phase or the first aerosol, along a filament and/or along the second or a third filament so that the second gaseous phase or the second aerosol forms activated particles. By means of the aforementioned combination with a second gaseous phase or a second aerosol, a coating to be formed can for example be influenced as regards its composition or condition. These comments apply as appropriate when using more than two gaseous phases and/or aerosols and/or more than the specified number of filaments.

By the addition of at least a second gaseous phase or a second aerosol further precursor compounds can be added in order to form further reactive compounds; in this connection however substances may also be added that react with the first gaseous phase or with the first aerosol so that (a) a new substance is formed that can be deposited on the substrate, or (b) further precursor compounds or (c) activated particles or (d) reactive compounds are produced. The added substance may also comprise one or more inert gases in order to delay further reactions, in particular the reverse reaction of reactive compounds into non-reactive compounds. An additional substance may also be added so that the flow velocity increases and the reactive compounds thus reach the substrate more quickly. Likewise, a substance may be added that makes the flow carrying the reactive compounds visible, so that a targeted guidance of the aforementioned flow onto the substrate to be coated is achieved. Furthermore the addition of a second gaseous phase or a second aerosol can effect a reaction, combination, activation or further co-operation with a third or further gaseous phase or with a third or further aerosol.

Preferred is a process according to the invention that is characterised in that the first and/or the optionally present second and/or an optionally present further gaseous phase or the first and/or the optionally present second and/or an optionally present further aerosol contains as precursor compound an organic compound and/or organosilicon compound and/or organometallic compound and/or an organoboron, organophosphorus or organoselenium compound. The material of the layer to be formed is determined by the choice of the precursor compounds.

The temperatures of at least one filament are preferably between 400 and 5000 K, in particular between 500 and 2000 K. The temperature of the relevant filament must be sufficiently high that ultimately (either directly or after the completion of secondary reactions) reactive compounds are formed. In this connection energy is imparted via the filament, so that the temperature of the reactive compound(s) when applied to the substrate also depends on the flow velocity. The filament temperature must not be chosen too high in order to avoid undesired chemical reactions in one of the gaseous phases and/or aerosols. The temperature of the flow that reaches the substrate and that carries the reactive compounds depends on the flow velocity of the gaseous phases and/or aerosols that are used and the interspacing of the filament or filaments from the substrate to be coated. In this respect the temperature of one or more filaments can indeed in many cases be higher than the temperature that would cause damage to the substrate. Nevertheless, when adjusting the upper temperature of the filament or filaments the permissible temperature of the substrate should be taken into account.

A further aspect of the invention relates to an apparatus for carrying out the process according to the invention, with
- a flow hollow body for guiding a flow of a gaseous phase or aerosol,
- a heatable filament that is arranged within the flow hollow body so that the flow of the gaseous phase or aerosol can be guided along the filament,
- a source for the gaseous phase or aerosol, and
- a line that connects the source to the flow hollow body so that the gaseous phase or the aerosol can flow from the source into the flow hollow body when the apparatus is operating.

The flow hollow body is preferably of tubular design with a preferably round cross-section. The cross-section may however also be of any other suitable shape, for example square or rectangular. Likewise the cross-section in the flow direction may vary. The material of the flow hollow body should be heat-resistant with respect to the temperature of the flow that is guided therein. The surface of the flow hollow body facing the flow should be resistant to the deposition of material from the guided flow or should be easy to clean.

The heatable filament may be formed in particular as a resistance wire through which an electric current flows to heat the wire. The necessary electric current is often provided by means of one or more standard mains circuit supplies. The term "filament" includes within the context of the present description also groups of two or more individual filaments.

The source for the gaseous phase or aerosol may for example be a gas cylinder. Likewise for example a mixing device that mixes a gas such as for example air with at least one solid and/or a liquid to form an aerosol and makes it available to the process is understood as a source. Also, ambient air can form the source for a gaseous phase or an aerosol.

The line that connects the source to the flow hollow body may for example be in the form of a flexible hose line or a pipeline. Likewise, the source may be arranged in the immediate vicinity of the flow hollow body, so that in this case for example the line is formed by a flange or also a tubular section, such as for example also a section of the flow hollow body.

Preferably the flow hollow body has a pressure-openable connection to the surroundings. Such a pressure-openable connection is in particular an opening in the flow hollow body from which the flow exits during operation, in order to be directed onto the substrate to be coated. The pressure-openable connection need not be an outlet opening however; according to an alternative design the flow can reach the substrate in the flow direction also in front of (upstream) of the pressure-openable connection to the surroundings, for example if the substrate is arranged within the flow hollow body. However, no connection screening the flow hollow body overall against the surrounding pressure is provided.

According to a further embodiment the flow hollow body of an apparatus according to the invention comprises at least one mixing-promoting means for guiding the second and/or at least one further gaseous phase or the second and/or a further aerosol. Such a mixing-promoting means may for example be a further tubular connecting sleeve, which for example is welded, flanged or bonded onto the outside of the flow hollow body and forms via an opening a connection to the interior of the flow hollow body. Preferably such a mixing-promoting means is arranged so that one or more further gaseous phases or aerosols guided therethrough are guided substantially in the flow direction of the flow of the first gaseous phase or of the first aerosol and thus also assist this flow. In order to promote the mixing action a mixing-promoting means is preferably in the form of a nozzle.

In many cases at least one further heatable filament is arranged in one or more mixing-promoting means. The further gaseous phase or aerosol fed through a mixing-promoting means can be heated by suitable heating means before entry into the flow hollow body. In this way a cooling of the flow present in the flow hollow body can for example be avoided. A filament advantageously arranged in a mixing-promoting means may alternatively or in addition excite the gaseous phase guided therein or the aerosol guided therein to form activated particles.

Particularly preferably the flow hollow body has a pressure-openable outlet opening for the exit of the gaseous phase or aerosol flow. Such an outlet opening may for example be designed simply as an open tube end. Designs favourable as regards flow technology that for example lead to a targeted flow are however preferably provided. Such a design favourable as regards flow technology may for example be in the form of a nozzle. In this way the exiting flow is in many cases also accelerated.

Preferably the apparatus according to the invention has means for generating the gaseous phase or aerosol flow. Such means may for example be a fan. Alternatively the flow can be generated by a pressure pump that pressurises at least one gaseous phase or at least one aerosol in a container before they are made available and/or fed to the apparatus according to the invention, so that the flow is formed when the components flow out from the container. As a further alternative a ventilator and/or a turbine and/or a pump may be used as means for generating the flow.

A layer system that is produced by means of the process according to the invention and/or the apparatus according to the invention preferably includes silicon and/or carbon and/or hydrogen and/or oxygen and/or nitrogen and/or phosphorus and/or boron and/or tin and/or zinc and/or aluminium and/or titanium and/or selenium.

In a coating produced according to the invention the layer thickness is advantageously between 0.5 nm and 50 μm; the coating may then in particular be used as a bonding layer or as an anti-corrosion layer or to modify the surface energy, in particular the wetting properties. The coating may also be used as a mechanical or electrical or optical function layer on a substrate.

The process according to the invention was tested on test metal sheets of lightweight metal (aluminium alloy AA 2024) having an area of $5\times10\ cm^2$. These surfaces were mechanically milled before being treated by the process. The fresh metal surface produced in this way was kept for at least three days in ambient air at room temperature. To deposit a layer by means of the process according to the invention laboratory equipment was used that was suitable for coating flat substrates. The deposited layer contains the elements silicon, oxygen, carbon and hydrogen.

The testing of the corrosion-inhibiting properties is performed by dripping a corrosive medium onto the test metal sheet. The test solution consists of 3 wt. % of sodium chloride as corrosive substance in extremely pure water.

The evaluation of the progress of the corrosion is made visually. Whereas the uncoated sample exhibits corrosion damage after four hours' test duration, in the case of the surface coated by the process according to the invention no corrosion damage could be detected even after 72 hours.

BRIEF DESCRIPTION OF THE DRAWING

The invention is described in more detail hereinafter by means of an embodiment and with the aid of a drawing, in which:

FIG. 1 shows diagrammatically in cross-section an apparatus according to the invention and a substrate with a surface to be coated.

DETAILED DESCRIPTION OF THE INVENTION

FIG. 1 shows a coating apparatus 2 and a substrate 40. The coating apparatus 2 comprises a flow hollow body 4 in which a flow 6 is guided and leaves at the outlet opening 8 in the direction of the substrate 40. A first gaseous phase 10 flows from a source (not shown) through the line 12, which is formed here as a section of the flow hollow body 4, into the flow hollow body 4.

A first heated filament 14 along which the first gaseous phase 10 is guided is arranged in the flow hollow body 4. The heated filament 14 is supplied with electric current from a mains source 16 and a feed line 18 and is thereby heated.

Four mixing-promoting means 20 to 23 for guiding and mixing further gaseous phases and/or aerosols with the first gaseous phase 10 are arranged on the flow hollow body 4. Chemico-physical interactions occur during the mixing with the first gaseous phase. In this connection the mixing-promoting means 20 and 21 are arranged in the flow direction behind the first filament 14, and the two mixing-promoting means 22 and 23 are arranged in the receptor flow direction in front of the first filament. The mixing-promoting means 20 and 22 are in addition provided in each case with a heated filament 24, 25, which is connected in each case by an electric cable to a mains circuit supply 26, 27. The mixing-promoting means 20 to 23 are open on the side facing away from the flow hollow body 4 so that they can be connected to sources for feeding further gaseous phases or aerosols.

In the execution of the process according to the invention an aerosol 30 can be mixed with the first gaseous phase 10, for example by the mixing-promoting means 23. The mixing takes place before the first gaseous phase 10 reaches the first heated filament 14, so that the mixture that is formed reaches the first heated filament 14 and is heated there.

A second aerosol 31 for example may be mixed with the first gaseous phase 10 by means of the mixing-promoting means 22, wherein the second aerosol is first of all heated at the heated filament 25 so that it forms activated particles. The first gaseous phase 10 thus mixes with the second aerosol and with the activated particles contained therein, whereby reactive compounds can form. Following this the aforementioned mixture then reaches the first filament 14, optionally (further) reactive compounds then being formed.

A (further) gaseous phase 32 can be mixed by means of the mixing-promoting means 21 with the first gaseous phase 10 and/or with the mixture formed by the mixing, in the flow direction behind the first heated filament 14. In this way an inert gas may for example be added in order to delay a reverse reaction of the reactive compounds into precursor compounds.

A (further) aerosol 33, which first of all is heated at the heated element 24, may for example be mixed with the first gaseous phase 10 or with the mixture by means of the mixing-promoting means 20. Due to the heating of the further aerosol 33 at the heated element 24 activated particles can form, which on mixing with the first gaseous phase 10 can lead to further reactive compounds.

By means of the mixing-promoting means 20 to 23 substances may also be added to the first gaseous phase 10 that are deposited (without previous participation in reactions) as a layer on the substrate 40 and should thus determine the composition of the layer.

The first gaseous phase 10 leaves, optionally together with the further admixed substances, the flow hollow body 4 as a flow 6 through the outlet opening 8 in the direction of the substrate 40. The stream density in the flow 6 is greater than 10 mole/(m²sec).

In order to achieve as uniform a coating of the substrate 40 as possible, the coating device 2 is guided in the movement direction 36 at a slight distance from and along the surface 41, 42 of the substrate 40. The movement direction 36 can however just as well be altered repeatedly during the coating procedure, so that the coating device 2 is driven for example backwards and forwards over the substrate in order for example to increase the layer thickness.

Several coating devices may be used simultaneously in order to coat a large surface area.

On account of the easy implementation of the process as well as the simple design of the apparatus, which may also be designed as a portable apparatus, in addition to its use in automated manufacturing processes the apparatus is also suitable for manual use.

The invention claimed is:

1. Process for the coating or modification of a surface, including the following steps:
   a) providing a first gaseous phase or a first aerosol, comprising one or more precursor compounds that can be converted into one or more reactive compounds by heating on a filament;
   b) converting said one or more precursor compound(s) into one or more reactive compound(s) by guiding a flow of the first gaseous phase or of the first aerosol along a first heated filament disposed in a flow hollow body; and
   c) leading the one or more reactive compound(s) formed according to step b) onto a substrate that is disposed outside of the flow hollow body and exposed to atmospheric pressure, to form a layer on or to modify a substrate surface;
   wherein the overall particle stream density in the flow after formation of the one or more reactive compound(s) is >10 mole/(m²s).

2. Process according to claim 1, characterised in that the first gaseous phase or the first aerosol contains at least one inert gas and/or air.

3. Process according to claim 2, characterised in that:
   step b) is carried out in a flow hollow body that guides the flow of the first gaseous phase or of the first aerosol and/or of the non-activated particles;
   the substrate is arranged outside the flow hollow body;
   the reactive compound(s) exit from the flow hollow body in a gaseous phase or aerosol flow directed Onto the substrate;
   at least a second gaseous phase or a second aerosol is combined with the first gaseous phase and/or with the first aerosol in the flow direction
   in front of the first filament and/or
   behind the first filament;
   the second gaseous phase or the second aerosol is guided along a filament and/or along the second or a third filament before the combination with the first gaseous phase or the first aerosol, so that the second gaseous phase or the second aerosol forms activated particles;
   the temperatures of at least one filament are between 400 and 5000 K.

4. Process according to claim 3, wherein the temperatures of at least one filament are between 500 and 2000 K.

5. Process according to claim 1, characterised in that the one or more reactive compound(s) exit from the flow hollow body in a gaseous phase or aerosol flow directed onto the substrate.

6. Process according to claim 1, characterised in that at least a second gaseous phase or a second aerosol is combined with the first gaseous phase and/or with the first aerosol in the flow direction
   in front of the first filament and/or
   behind the first filament.

7. Process according to claim 6, characterised in that the second gaseous phase or the second aerosol is guided along a filament and/or along the second or a third filament before the combination with the first gaseous phase or the first aerosol, so that the second gaseous phase or the second aerosol forms activated particles.

8. Process according to claim 1, characterised in that the temperatures of at least one filament are between 400 and 5000 K.

9. Process according to claim 8, wherein the temperatures of at least one filament are between 500 and 2000 K.

* * * * *